(12) United States Patent
Nagase et al.

(10) Patent No.: US 11,903,146 B2
(45) Date of Patent: Feb. 13, 2024

(54) PRINTED WIRING BOARD AND METHOD FOR MANUFACTURING PRINTED WIRING BOARD

(71) Applicant: KYOCERA Corporation, Kyoto (JP)

(72) Inventors: Tomoya Nagase, Kurobe (JP); Takashi Ishioka, Namerikawa (JP)

(73) Assignee: Kyocera Corporation, Kyoto (JP)

( * ) Notice: Subject to any disclaimer, the term of this patent is extended or adjusted under 35 U.S.C. 154(b) by 255 days.

(21) Appl. No.: 17/615,132

(22) PCT Filed: May 29, 2020

(86) PCT No.: PCT/JP2020/021368
§ 371 (c)(1),
(2) Date: Nov. 30, 2021

(87) PCT Pub. No.: WO2020/241831
PCT Pub. Date: Dec. 3, 2020

(65) Prior Publication Data
US 2022/0232709 A1 Jul. 21, 2022

(30) Foreign Application Priority Data
May 31, 2019 (JP) ................. 2019-102609

(51) Int. Cl.
*H05K 3/46* (2006.01)
*H05K 1/11* (2006.01)

(52) U.S. Cl.
CPC .......... *H05K 3/4644* (2013.01); *H05K 1/115* (2013.01)

(58) Field of Classification Search
CPC ............. H05K 3/4644; H05K 1/115; H05K 2201/037; H05K 2201/09072; H05K 2201/096; H05K 2201/10098
See application file for complete search history.

(56) References Cited

U.S. PATENT DOCUMENTS

| 7,023,707 | B2 | 4/2006 | Fraley et al. | |
|---|---|---|---|---|
| 2001/0039727 | A1 | 11/2001 | Terauchi et al. | |
| 2005/0284655 | A1* | 12/2005 | Hsu ...................... | H05K 3/4602 174/258 |
| 2008/0164057 | A1* | 7/2008 | Mori ...................... | H05K 3/421 174/262 |
| 2012/0167386 | A1 | 7/2012 | Goergen et al. | |
| 2017/0181270 | A1 | 6/2017 | Rose et al. | |

FOREIGN PATENT DOCUMENTS

| EP | 2405726 A2 | 1/2012 |
|---|---|---|
| JP | 2000-183524 A | 6/2000 |
| JP | 2003-209411 A | 7/2003 |
| JP | 2014-187369 A | 10/2014 |
| WO | 2017/164300 A1 | 9/2017 |

* cited by examiner

*Primary Examiner* — Sherman Ng
(74) *Attorney, Agent, or Firm* — Volpe Koenig

(57) ABSTRACT

A printed wiring board is provided with: a core substrate corresponding to a stack area in which an interlayer connection conductor constituting an inner via is continuous; and a build-up layer comprising a resin layer stacked on the core substrate and a conductor layer on said resin layer. A via inner space inside the interlayer connection conductor constituting the inner via is hollow, and said via inner space communicates to the outside via a hole section provided in the build-up layer.

5 Claims, 4 Drawing Sheets

PRINTED WIRING BOARD AND METHOD FOR MANUFACTURING PRINTED WIRING BOARD

TECHNICAL FIELD

The present disclosure concerns a printed wiring board having vias and a method for manufacturing a printed wiring board.

BACKGROUND ART

Conventionally, in printed wiring boards, an interlayer connection structure in which an interlayer connection conductor is installed in a hole provided in a resin layer, i.e., a so-called via, is often configured. The interlayer connection conductor electrically connects two conductor layers of different layers across the resin layer (JP 2003-209411A and JP 2014-187369A).

Vias are generally classified into:
through-holes through all layers of a printed wiring board; and
interstitial (inner) vias through some layers of a printed wiring board.

The interstitial (inner) vias are generally classified into:
blind vias that through surfaces and inner layers of a printed wiring board; and
buried vias through inner layers and inner layers of a printed wiring board.

In the case of through holes, two terminations of an interlayer connection conductor installed in a hole reach one surface and the other surface of a printed wiring board, respectively.

In the case of blind vias, one termination of an interlayer connection conductor installed in a hole reaches either one or the other surface of a printed wiring board. The other termination stays in an inner layer.

In the case of buried vias, two terminations of an interlayer connection conductor installed in a hole both stay in inner layers.

SUMMARY OF INVENTION

According to an aspect of the present disclosure, a printed wiring board includes:
a core substrate; and
one or more build-up layers,
wherein
the core substrate corresponds to a layer range where an interlayer connection conductor that constitutes an inner via is continuous,
each of the one or more build-up layers comprises a resin layer layered on the core substrate and a conductor layer on the resin layer,
a via inner space inside the interlayer connection conductor that constitutes the inner via is hollow, and
the via inner space is connected to an outside through one or more holes provided in the one or more build-up layers.

According to another aspect of the present disclosure, a method for manufacturing a printed wiring board includes:
preparing, as a core substrate, a member which corresponds to a layer range where an interlayer connection conductor constituting an inner via is continuous and which includes a via inner space which is hollow and which is inside the interlayer connection conductor constituting the inner via;
preparing, as one or more build-up layers, one or more members which include one or more holes formed in advance; and
layering the core substrate and the one or more build-up layers such that the one or more holes of the one or more build-up layers are continuous with the via inner space.

DESCRIPTION OF EMBODIMENTS

Holes through all layers for forming a through-hole are left hollow. Then, a hollow through-hole connecting one surface of a printed wiring board to the other surface is obtained. For example, the hollow through-hole can be used as a waveguide space that transmits a transmission signal from an antenna to a receiver circuit. The antenna is laid on one surface of a multilayer substrate. The receiver circuit is constituted by an MMIC or similar device mounted on the other surface. The waveguide space is filled with air.

However, a hole in a core substrate for forming an interstitial (inner) via is closed by build-up layers which are layered outside of it.

In another case, a hole through only a portion between inner layers to which a buried via connects is made hollow. A sealed hollow structure is made by confining the hole with build-up layers on both sides. The inside of the sealed hollow structure can be a waveguide space where air is trapped.

However, resin of the build-up layers flows into the hole. Alternatively, resin with low flowability is selected so that the resin does not flow into the hole. Even in that case, heat during a build-up process causes air inside to expand. It may destroy the build-up layer. It is difficult to obtain a sealed hollow structure.

First, a printed wiring board of an embodiment of the present disclosure will be described with reference to FIGS. 1 and 2.

Figure 1:
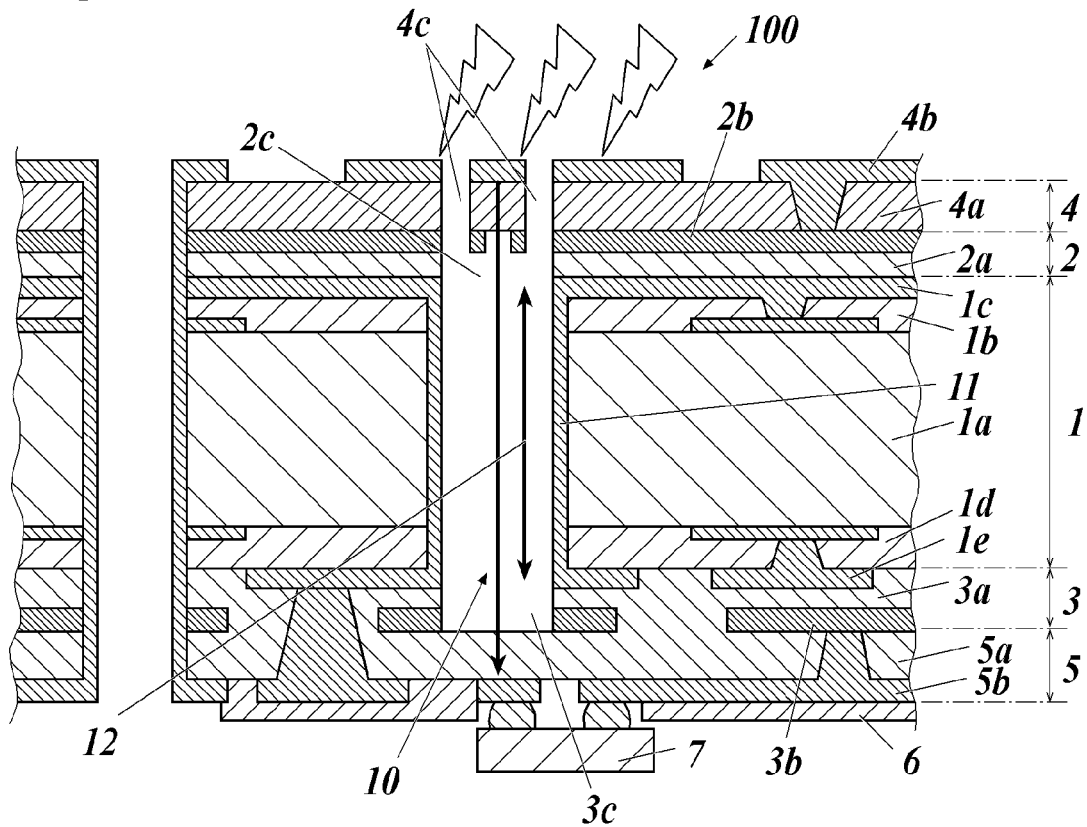
FIG. 1 is a schematic cross-sectional view of a printed wiring board according to one embodiment.

As shown in FIG. 1, the printed wiring board 100 includes a core substrate 1, build-up layers 2, 3, 4, 5 on the core substrate 1, and a solder resist 6. In FIG. 1, an example in which the printed wiring board 100 includes an IC chip 7 is shown.

The core substrate 1 includes circuit patterns formed on both sides of an insulating substrate 1a. The core substrate 1 includes resin layers 1b, 1d and conductor layers 1c, 1e.

An inner via 10 is configured in the core substrate 1. An interlayer connection conductor 11 is adhered to and formed on an inner surface of a hole through the core substrate 1. It connects a circuit pattern of the conductor layer 1c to a circuit pattern of the conductor layer 1e. The core substrate 1 is a part corresponding to a layer range where the interlayer connection conductor 11 is continuous. The number of layers of the core substrate 1 can be any.

The build-up layer 2 includes a resin layer 2a and a conductor layer 2b on the resin layer 2a. The build-up layer 3 includes a resin layer 3a and a conductor layer 3b on the resin layer 3a. The build-up layer 4 includes a resin layer 4a and a conductor layer 4b on the resin layer 4a. The build-up layer 5 includes a resin layer 5a and a conductor layer 5b on the resin layer 5a.

The build-up layer 2 is layered on an upper surface of the core substrate 1 in FIG. 1. Further, a build-up layer 4 is layered on an upper surface of the build-up layer 2. Thus, build-up layers (2, 4) that continue in a layering direction are provided.

The build-up layer 3 is layered on a lower surface of the core substrate 1 in FIG. 1. Further, the build-up layer 5 is layered on a lower surface of the build-up layer 3. Thus, build-up layers (3, 5) that continue in a layering direction are provided.

The build-up layers 2, 3 are first build-up layers on the core substrate 1. The build-up layers 4, 5 are second build-up layers over the core substrate 1.

As described above, the build-up layers are provided on both sides of the core substrate 1.

A via inner space 12 inside the interlayer connection conductor 11 constituting the inner via 10 is hollow.

On an upper side of the core substrate 1 in FIG. 1, the via inner space 12 is connected to the outside through holes 2c, 4c provided in the build-up layers 2, 4, respectively. That is, the via inner space 12 is connected to the outside through the holes 2c, 4c formed in the build-up layers 2, 4 so as to be continuous.

On a lower side of the core substrate 1 in FIG. 1, the via inner space 12 is connected to a hole 3c in the build-up layer 3 and is closed by a resin layer 5a of the build-up layer 5. That is, in the printed wiring board 100 shown in FIG. 1, the via inner space 12 has a single-opening structure. In the single-opening structure, the via inner space 12 is connected to the outside through the holes 2c, 4c formed in the build-up layers 2, 4 only on one side (upper side in FIG. 1) of the printed wiring board 100.

In FIG. 1, a mounting pad constituted by a conductor layer 5b of the build-up layer 5 is formed also at a portion right below the via inner space 12. An IC chip 7 is mounted there.

Figure 2:
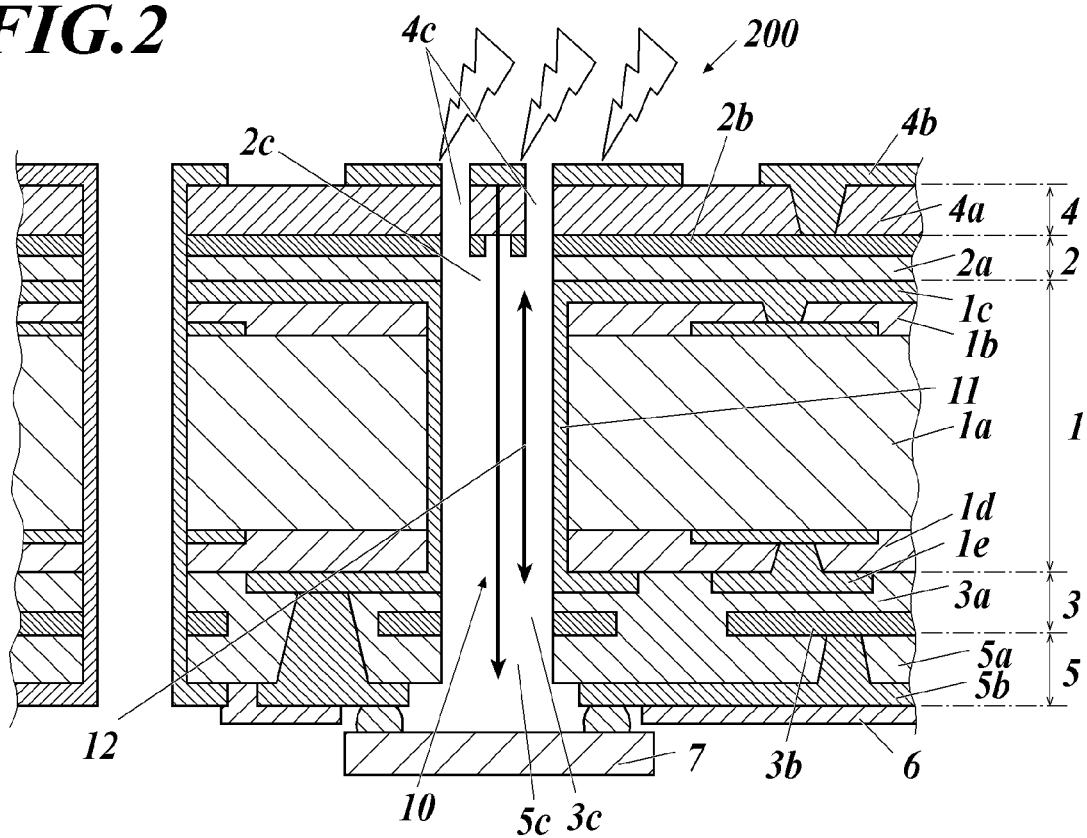
FIG. 2 is a schematic cross-sectional view of a printed wiring board according to one embodiment.

On the other hand, as in a printed wiring board 200 shown in FIG. 2, a hole 5c may be provided also in the build-up layer 5. In that case, the via inner space 12 is connected to the outside through the holes 3c, 5c formed in the build-up layers 3, 5 respectively, even on the lower side of the core substrate 1 in FIG. 2. That is, the printed wiring board 200 shown in FIG. 2 has a double-opening structure. In the double-opening structure, the via inner space 12 is connected to the outside through the holes (2c, 3c, 4c, 5c) formed in the build-up layers (2, 3, 4, 5) on both sides (upper and lower sides in FIG. 2) of the printed wiring board 200. A mounting pad for the IC chip 7 is provided around the hole 5c. The IC chip 7 is mounted across the hole 5c.

In the printed wiring boards 100, 200 of the embodiments, the topmost conductor layer 4b in the figure constitutes an antenna. As the IC chip 7 mounted on the lower side in the figure, an MMIC including a receiver circuit is applied. As the resin layer 4a of the build-up layer 4 constituting a surface antenna layer, a resin material different from the resin layers 2a, 3a, 5a of the build-up layers 2, 3, 5 constituting other control circuits is applied. To increase efficiency of signal transfer between the IC chip 7 and the antenna, resin materials of the resin layer 4a and the resin layer 5a are made the same.

A transmission signal from the antenna of the conductor layer 4b propagates in air with a relative dielectric constant of 1.0 in the holes 4c, 2c, the via inner space 12, and the hole 3c (and the hole 5c) to reach the IC chip 7.

In the case of the printed wiring board 200 shown in FIG. 2, the antenna and the IC chip 7 face each other across a hollow space of the holes 4c, 2c, the via inner space 12, the hole 3c, and the hole 5c.

Circuit components (through holes, inner vias, and circuit patterns of layers) other than those described above are shown in FIGS. 1 and 2. They may or may not be included, and may have any specific configuration.

Next, the following two manufacturing methods 1, 2 for printed wiring boards will be described.

Figure 5:
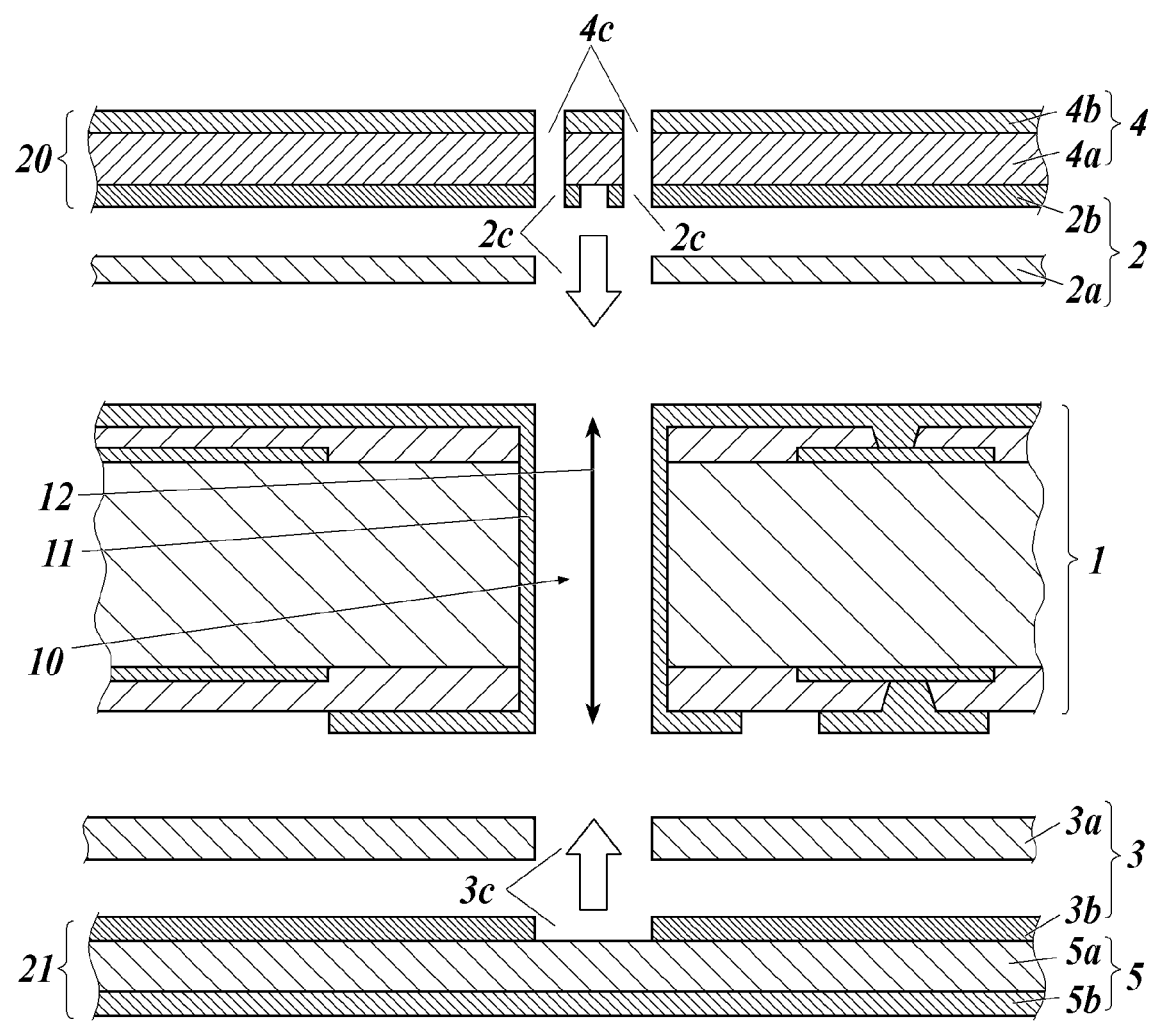
FIG. 5 is a schematic cross-sectional view illustrating a method for manufacturing a printed wiring board according to one embodiment.

Manufacturing Method 1—FIG. 5

The manufacturing method 1 is an example in which a single-opening structure is made in an inner via of a printed wiring board.

Steps carried out in the method are:
 a step of preparing the core substrate 1 including a hollow via inner space;
 a step of preparing the build-up layers 2, 3 in which holes are formed in advance; and
 a step of layering the core substrate 1 and the build-up layers 2, 3 such that the holes of the build-up layers 2, 3 is continuous with the via inner space 12.

As shown in FIG. 5, a double-sided plate 20 is layered on the core substrate 1 via the resin layer 2a. The double-sided plate 20 is a composite of three parts, i.e., the conductor layer 2b, the resin layer 4a, and the conductor layer 4b. A double-sided plate 21 is layered via the resin layer 3a. The double-sided plate 21 is a composite of three parts, i.e., the conductor layer 3b, the resin layer 5a, and the conductor layer 5b. The resin layer 2a side of the build-up layer 2 is aligned with one surface of the core substrate 1. The resin layer 3a side of the build-up layer 3 is aligned with the other surface of the core substrate 1. They are joined by heat pressing.

The holes 2c are formed in the resin layer 2a and the conductor layer 2b in advance. The holes 3c are formed in the resin layer 3a and the conductor layer 3b in advance. The holes 4c are formed in the resin layer 4a and the conductor layer 4b in advance. The holes 2c, 3c, 4c are layered such that they continue to the via inner space 12.

Further, for the double-sided plate 20, a circuit formation process is carried out on the conductor layers 2b, 4b.

Prepreg is applied to the resin layer 2a and resin layer 3a. In the prepreg, the holes 2c, 3c are formed by laser processing or the like before layering. Punching with a die, drilling, and the like can also be applied.

Materials with properties that prevent resin from flowing due to heat during heat pressing should be selected for the prepreg. GIA-671N (Hitachi Chemical) is suitably used.

This layering process is performed on the core substrate 1 while the inner via 10 is already configured and the via inner space 12 remains hollow. Common inner vias are filled with resin. Screen-printing is generally applied as the method. In a case where there is a via that needs to be filled with resin other than the inner via 10 which is to be left hollow, a portion of a screen printing plate corresponding to the inner via 10 is not opened (it is blocked). It allows the inner via 10 to remain hollow.

Except for the IC 7, a multilayer structure of the printed wiring board 100 shown in FIG. 1 is obtained by the layering process.

The build-up layer 4 forms an antenna and has the hole 4c. Therefore, as the double-sided plate 20, a double-sided plate of low dielectric constant and low dielectric loss tangent material, such as R-F705T, R-5775, R-5885, R-5515 (Panasonic), or RO3003 (Rogers Corporation), is used. To increase efficiency of signal transfer between the IC chip 7 and the antenna, it is suitable to use the same resin as the resin layer 4a for the resin layer 5a of the build-up layer 5.

After the layering process, a bottom through-hole is drilled. Electrolytic plating is applied to side walls of the bottom through-hole. Then, the circuit formation process is carried out.

Figure 3:
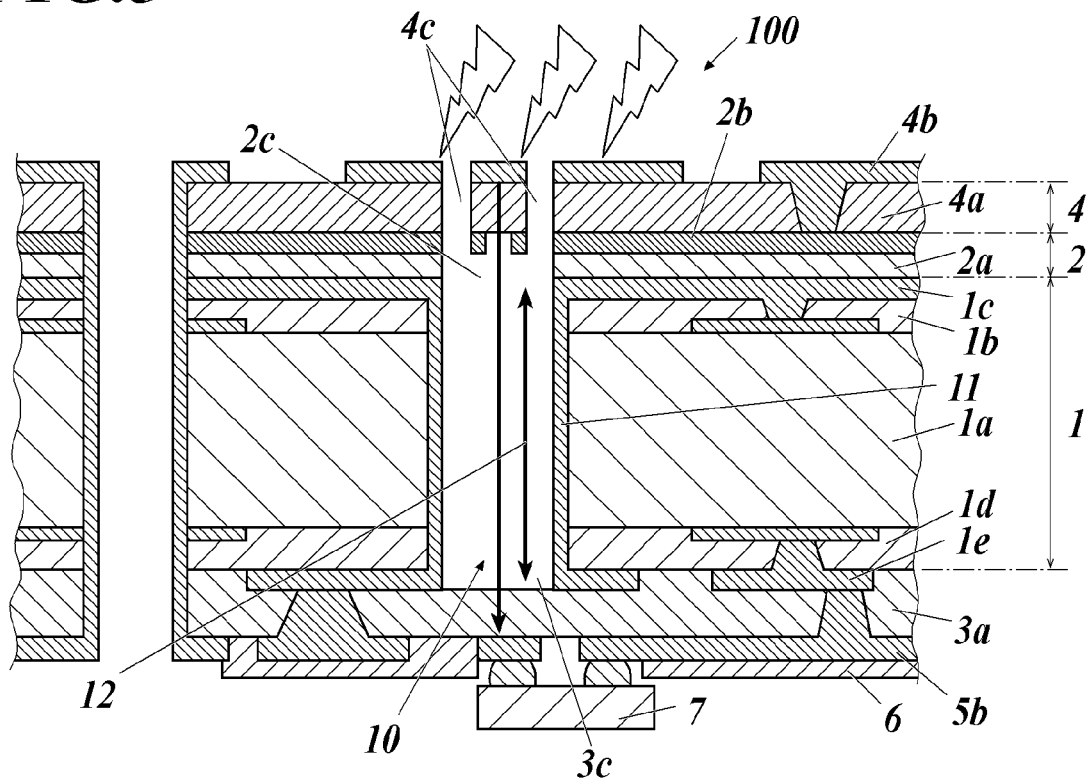
FIG. 3 is a schematic cross-sectional view of a printed wiring board according to one embodiment.

FIG. 5 shows an example in which an eight-layer printed wiring board is manufactured by layering the double-sided boards 20, 21 on top and bottom of the core substrate 1, respectively. In a case where wiring scale below the core substrate 1 is small, the double-sided plate 21 layered on the lower side of the core substrate 1 may be replaced with copper foil. The result is a seven-layer printed wiring board as shown in FIG. 3. In that case, as in the case of the eight-layer printed wiring board shown in FIG. 5, a bottom through-hole is drilled after the layering process. Electrolytic plating is applied to an inner wall of the bottom through-hole, and then the circuit formation process is carried out. When the prepreg is opened to form the hole 3c, an area of only copper foil appears in the hollow. Wrinkles tend to have a negative effect on circuit formation. Therefore, careful consideration should be given to provision of the hole 3c.

Figure 6:
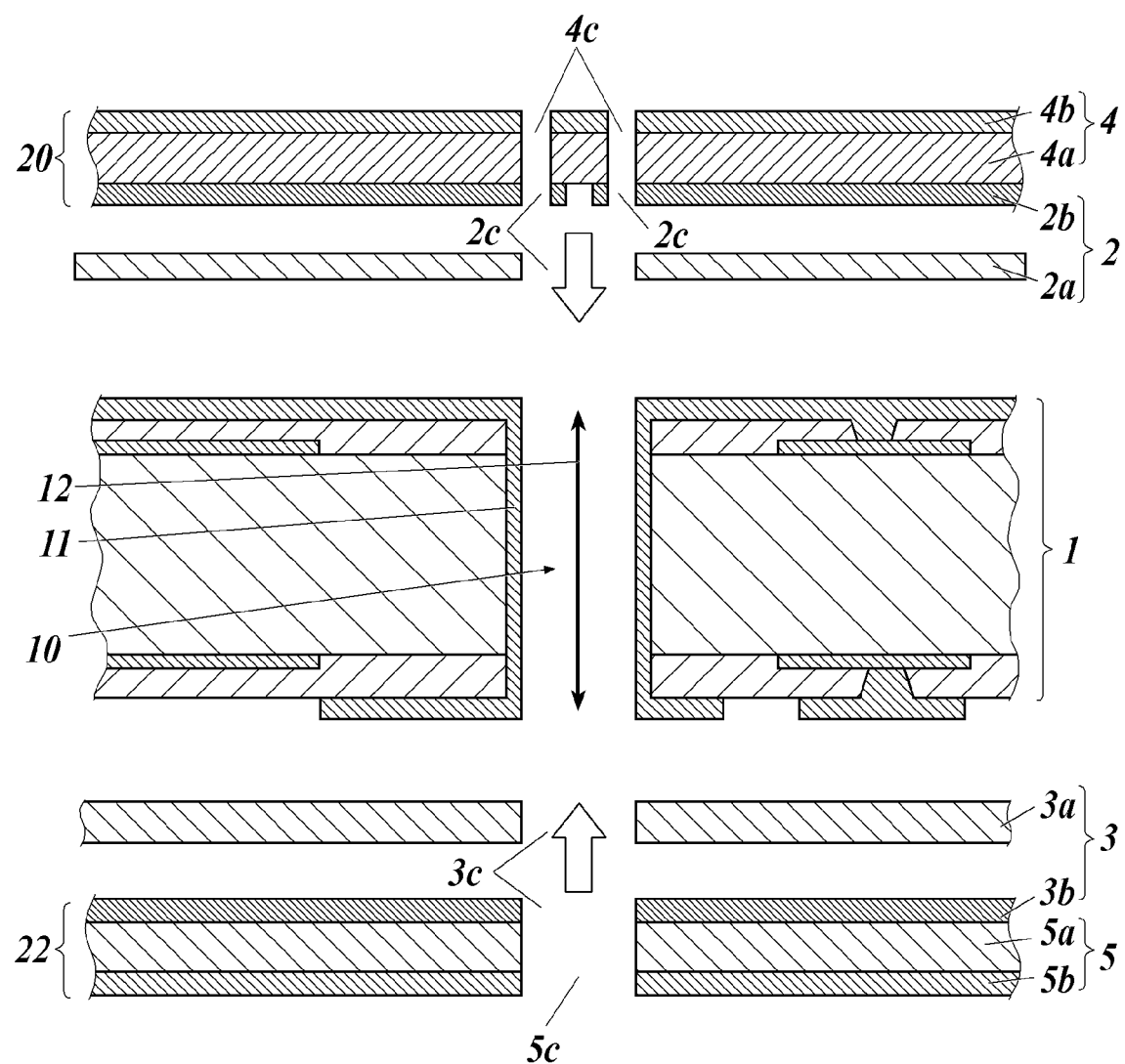
FIG. 6 is a schematic cross-sectional view illustrating a method for manufacturing a printed wiring board according to one embodiment.

Manufacturing Method 2—FIG. 6

The manufacturing method 2 is an example where a double-opening structure is made in an inner via of a printed wiring board.

The method differs from the manufacturing method 1 in that holes for forming the holes 3c, 5c are also pre-formed in a double-sided plate 22 constituted by the conductor layer 3b, the resin layer 5a, and the conductor layer 5b. The holes 2c, 3c, 4c, 5c are layered such that they are continuous with the via inner space 12. Except for the above, the manufacturing method 2 is the same as the first embodiment.

Figure 4:
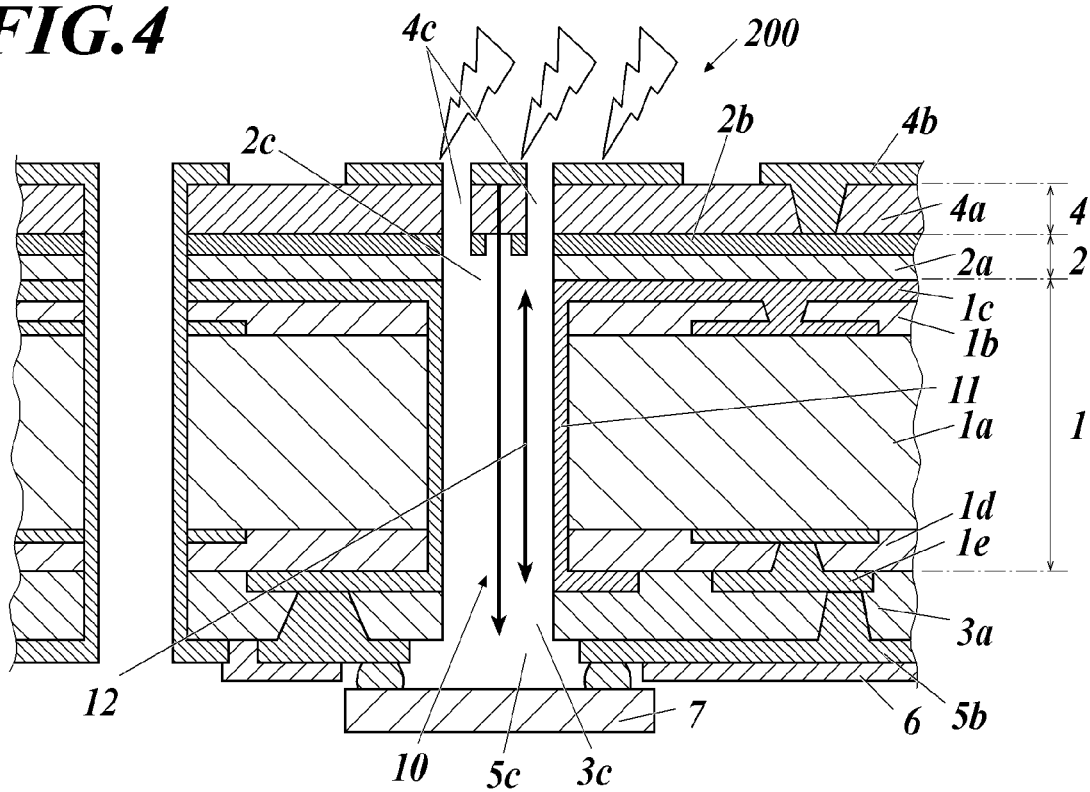
FIG. 4 is a schematic cross-sectional view of a printed wiring board according to one embodiment.

Similarly, as shown in FIG. 4, a seven-layer printed wiring board can be made in the double-opening structure as well.

The figure shows a case where an antenna pattern is placed right above the via inner space 12 as well.

According to the printed wiring board of the embodiment of the present disclosure described above, the interstitial (inner) via is hollow and open to the outside.

According to the method for manufacturing a printed wiring board of the embodiment of the present disclosure, a structure in which an interstitial (inner) via is hollow and open to the outside is obtained.

The embodiments of the present disclosure are described above, but these embodiments are shown as an example, and various other embodiments are possible. The components may be omitted, replaced or modified within the scope of the claims of the invention.

In the above embodiments, two build-up layers are provided on each side the core substrate 1. Alternatively, one build-up layer may be provided on each side. Also, three or more build-up layers may be provided on each side.

In the above embodiments, build-up layers are provided on both sides of the core substrate 1. The inner via 10 is a buried via. Alternatively, the build-up layer may be provided only on one side of the core substrate 1. In that case, the inner via is a blind via.

In the examples, the present invention is applied to a communication circuit board. However, the printed wiring board of the present disclosure is not limited to those examples.

An interstitial (inner) via in the present disclosure is a via in the broad sense. It includes not only vias which have both ends kept in inner layers, but also vias which have just one end kept in inner layers.

INDUSTRIAL APPLICABILITY

The present disclosure may be used for a printed wiring board and a method for manufacturing a printed wiring board.

REFERENCE SIGNS LIST 1 core substrate
2, 3, 4, 5 build-up layer
2a resin layer
2b conductor layer
2c hole
3a resin layer
3b conductor layer
3c hole
4a resin layer
4b conductor layer
4c hole
5a resin layer
5b conductor layer
5c hole
10 inner via
11 interlayer connection conductor
12 via inner space
100, 200 printed wiring board

The invention claimed is:

1. A printed wiring board, comprising: a core substrate; and one or more build-up layers, wherein the core substrate corresponds to a layer range where an interlayer connection conductor that constitutes an inner via is continuous, each of the one or more build-up layers comprises a resin layer layered on the core substrate and a conductor layer on the resin layer, a via inner space inside the interlayer connection conductor that constitutes the inner via is hollow, the via inner space is connected to an outside through one or more holes provided in the one or more build-up layers, wherein the one or more build-up layers are a plurality of build-up layers that continue in a layering direction, the one or more holes are a plurality of holes which are provided in the plurality of build-up layers so as to be continuous, the plurality of holes are hollow such that the via inner space is connected and open to the outside through the plurality of holes; and wherein the plurality of holes are continuous with the via inner space.

2. The printed wiring board according to claim 1, wherein the one or more build-up layers are provided on both sides of the core substrate.

3. The printed wiring board according to claim 2, wherein the via inner space is connected to the outside through the one or more holes in the one or more build-up layers on both sides of the printed wiring board.

4. A method for manufacturing a printed wiring board, comprising: preparing, as a core substrate, a member which corresponds to a layer range where an interlayer connection conductor constituting an inner via is continuous and which includes a via inner space which is hollow and which is inside the interlayer connection conductor constituting the inner via; preparing, as one or more build-up layers, one or more members which include one or more holes formed in advance; layering the core substrate and the one or more build-up layers such that the one or more holes of the one or more build-up layers are continuous with the via inner space, wherein the one or more build-up layers are a plurality of build-up layers, the one or more holes are a plurality of holes, the plurality of holes are hollow such that the via inner space is connected and open to the outside through the plurality of holes, and the plurality of build-up layers are layered on the core substrate such that the plurality of holes are layered over the via inner space so as to be continuous.

5. The method for manufacturing the printed wiring board according to claim 4, wherein the one or more build-up layers are layered on both sides of the core substrate.

\* \* \* \* \*